(12) United States Patent
Brechbill et al.

(10) Patent No.: US 6,649,836 B2
(45) Date of Patent: Nov. 18, 2003

(54) COMPRESSOR ELECTRONICS HOUSING

(75) Inventors: Dana L. Brechbill, Fort Wayne, IN (US); George C. Yang, Fort Wayne, IN (US); Michael W. Branson, Noblesville, IN (US); Michael Collins, Syracuse, NY (US); David W. Hamilton, Marion, IN (US)

(73) Assignee: Carrier Corporation, Farmington, CT (US)

( * ) Notice: Subject to any disclaimer, the term of this patent is extended or adjusted under 35 U.S.C. 154(b) by 2 days.

(21) Appl. No.: 09/848,199

(22) Filed: May 4, 2001

(65) Prior Publication Data

US 2002/0163785 A1 Nov. 7, 2002

(51) Int. Cl.$^7$ .............................................. H01R 13/46
(52) U.S. Cl. ........................ 174/60; 361/825; 361/827; 439/207; 439/540; 439/540.1; D08/356; 277/55; 277/56
(58) Field of Search ........................... 174/60; 361/825, 361/827; 439/207, 540, 540.1; D08/356; 277/55, 56

(56) References Cited

U.S. PATENT DOCUMENTS

| | | | |
|---|---|---|---|
| 4,815,984 A | * | 3/1989 | Sugiyama et al. ......... 172/72 A |
| 4,923,113 A | * | 5/1990 | Guijarro ................. 229/125.27 |
| 5,173,057 A | * | 12/1992 | Bunch et al. ................ 439/149 |
| 5,301,086 A | * | 4/1994 | Harris et al. ................ 361/641 |
| 5,425,657 A | * | 6/1995 | Davis et al. ................. 439/405 |
| 5,568,362 A | * | 10/1996 | Hansson ....................... 174/50 |
| 5,674,090 A | * | 10/1997 | Sumida et al. .............. 439/535 |
| 5,763,832 A | * | 6/1998 | Anselm ....................... 174/135 |
| 6,041,605 A | | 3/2000 | Hendricks |

* cited by examiner

Primary Examiner—Dean A. Reichard
Assistant Examiner—Anton Harris

(57) ABSTRACT

Housing is provided for electronic circuitry that monitors the operation of a compressor. The housing includes a module containing the electrical circuitry as well as electrical connectors that connected the circuitry to external wiring. The module is mounted to an external housing member. The wiring inserts through an opening in the external housing member before being connect to the electrical connectors associated with the electronic module. Further openings in the housing member receive conduits carrying further wiring. The conduits extend outwardly from the housing member so as to allow the wiring in the conduits to be supported for an appreciable distance from the housing. A removable housing member is connected to the aforementioned housing member so as to cover the wiring connected to the electrical connectors associated with the electronic module. The removable housing member is easily removed from the aforementioned housing member so as to thereby allow access to the various connections of wiring to the electrical connectors associated with the electronic module.

10 Claims, 4 Drawing Sheets

COMPRESSOR ELECTRONICS HOUSING

FIELD OF THE INVENTION

This invention relates to electronics for monitoring the operation of a compressor and in particular to the housing for such electronics.

BACKGROUND AND SUMMARY OF THE INVENTION

Compressors are critical components in refrigeration, air conditioning, and heat pump systems. As such, it is important that the operation of a compressor be closely monitored so that corrective action can be taken when necessary. An example of a compressor monitoring device is disclosed in commonly assigned U.S. Pat. No. 6,041,605 entitled "Compressor Protection" issued to Anton Hendricks.

In order to monitor the operation of a compressor, the compressor monitoring device must gather information from a number of points in the compressor. It is preferable that the compressor monitoring device be located as near as possible to these points which are typically sensors providing the information as to the compressor's operation. It is also preferable that the compressor monitoring device be located close to control points on the compressor, which activate various locally controlled parts of the compressor. The compressor monitoring device must also be capable of receiving and transmitting signals to a higher level controller, which is usually dedicated to the control of the system in which the compressor resides. It is hence to be appreciated that a compressor monitoring device must be capable of forming electrical connections to both sensors and control points in the compressor as well as to a higher level controller. Any such connections must be capable of withstanding vibration and other harsh conditions produced by the compressor.

The present invention provides a compressor monitoring device, which is preferably mounted to the compressor so as to thereby be relatively close to both control points on the compressor as well as the sensors providing information as to the operation of the compressor. The monitoring device preferably includes a module containing electrical circuitry that gathers and monitors the information provided by the sensors. The electronic module also includes electrical connectors that are connected to wiring from the sensors as well as electrical connectors that are connected to wiring to control points and wiring from a remotely located control. The remotely located control is typically a high level control usually for the system in which the compressor is operating in. The wiring from the sensors and the remotely located control inserts through a hole in a housing member before being connected to the electrical connectors associated with the electronic module. Further openings in the housing member receive conduits carrying further wiring. The conduits preferably threadably engage the openings in the housing member and are maintained in place by lock nuts. The conduits extend outwardly from the housing member so as to allow the wiring in the conduits to be supported for an appreciable distance from the monitoring device. The wiring exits the threaded end of the conduit and is connected to further electrical connectors associated with the mounted electronic module.

In accordance with the invention, a removable housing member is connected to the aforementioned housing member. The removable housing covers the wiring connected to the electrical connectors associated with the electronic module. The removable housing member is easily removed from the aforementioned housing member so as to thereby allow access to the various electrical connections of wiring to electrical connectors associated with the electronic module. In this manner, the various connections between the wiring and the receptacles associated with the electronic module can be examined and possibly fixed or replaced if necessary.

BRIEF DESCRIPTION OF THE DRAWINGS

For a fuller understanding of the invention, reference should now be made to the following detailed description thereof taken in conjunction with the accompanying drawings, wherein.

DESCRIPTION OF THE PREFERRED EMBODIMENT

Figure 1:
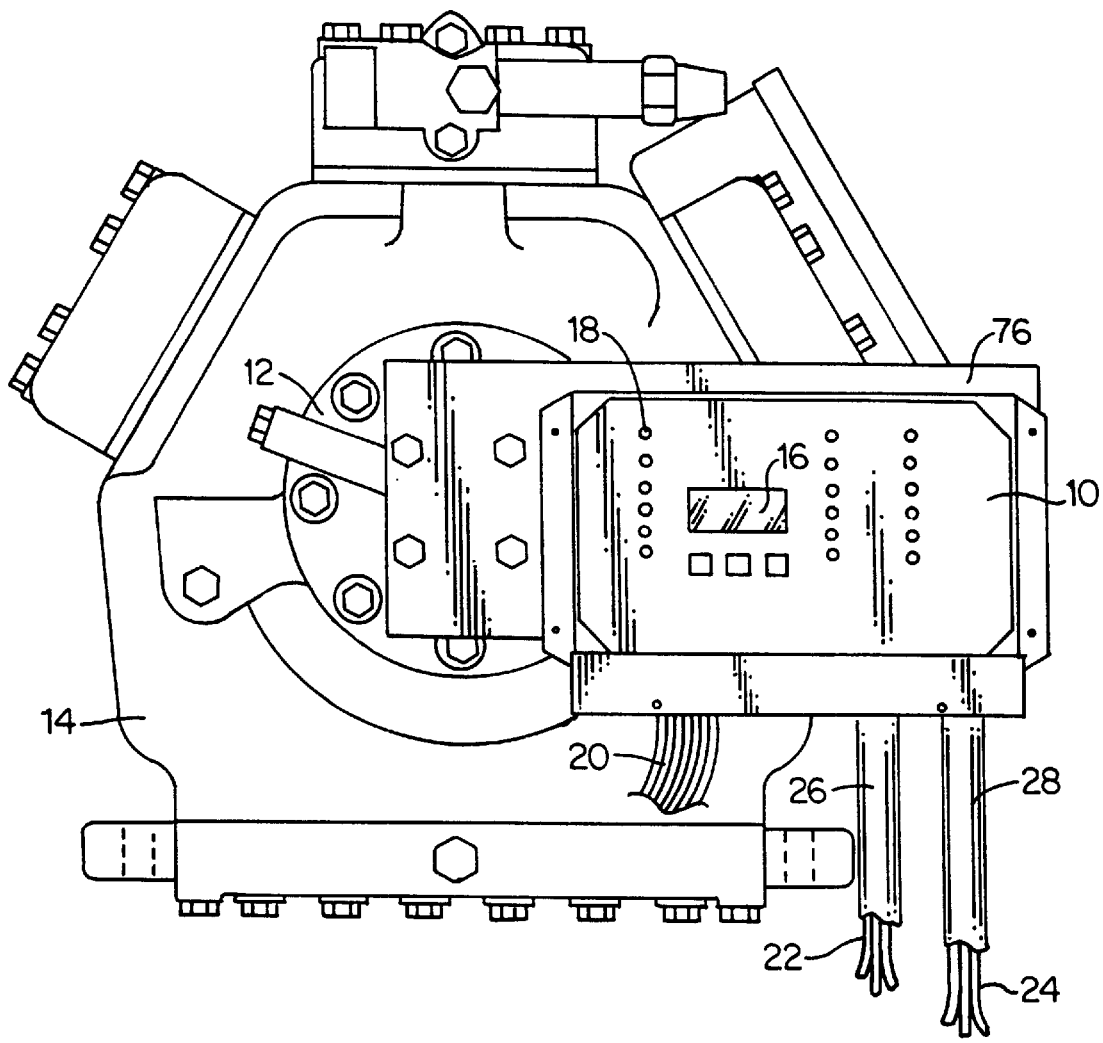
FIG. 1 illustrates a compressor monitoring device connected to the end of a compressor.

Referring to FIG. 1, a compressor monitoring device 10 is mounted to an end 12 of a compressor 14. The compressor monitoring device includes a display 16 as well as various light emitting diodes such as 18, which display information as to the status of the compressor 14. In order to display this information, it is necessary to collect information from various sensors mounted on or within the compressor 14. This collected information is provided to the compressor monitoring device 10 by a portion of the wiring generally labeled 20. Another portion of the wiring 20 connects the compressor monitoring device to a remotely located control for the system in which the compressor is operating in. A still further portion of the wiring 20 connects the compressor monitoring device to control points in the compressor 14.

The compressor monitoring device 10 also receives wiring 22 and 24 through cylindrical conduits 26 and 28. The cylindrical conduits 26 and 28 are of a length so as to support the wiring 22 and 24 for a substantial distance from the compressor.

Figure 2:
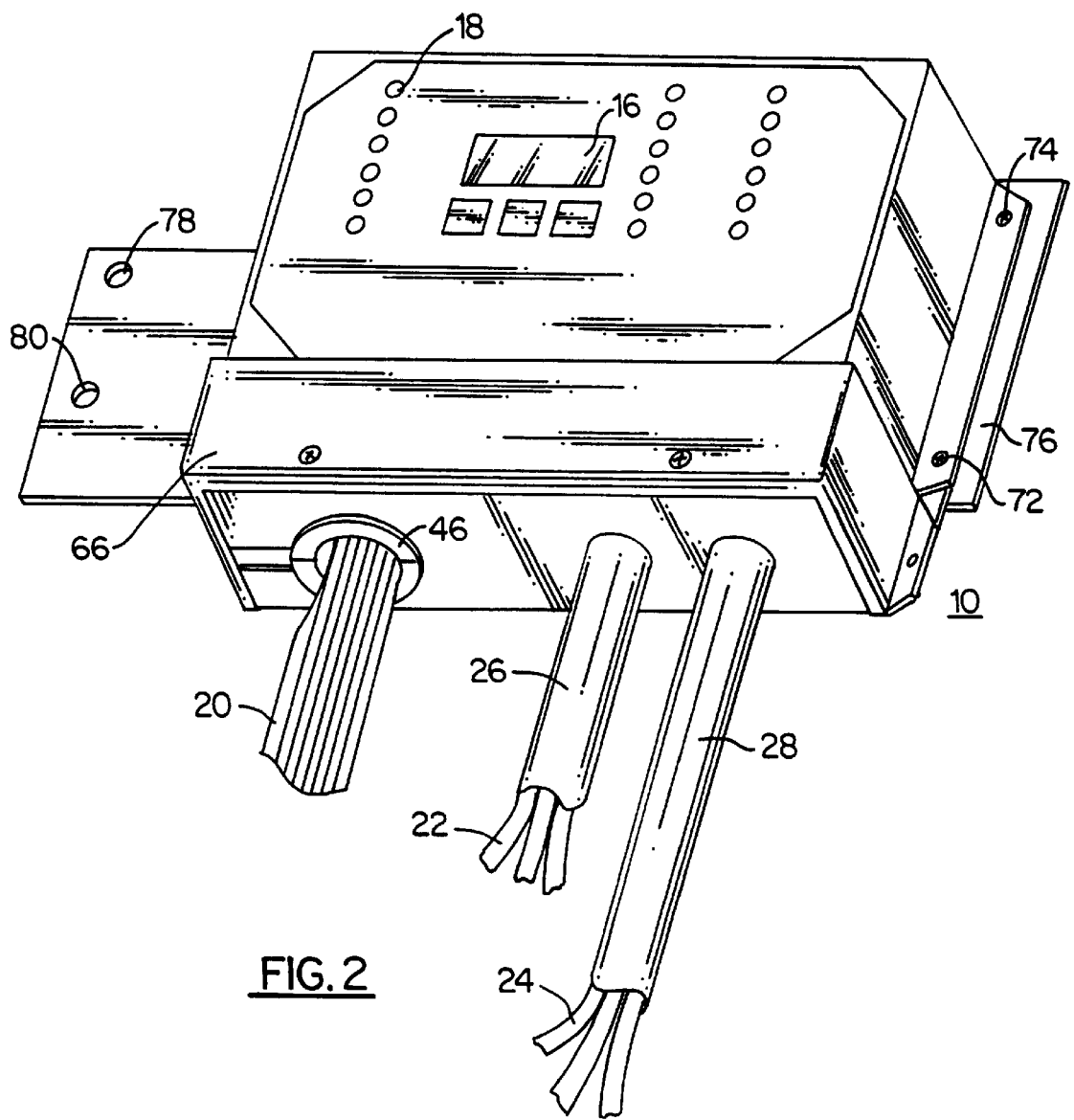
FIG. 2 is a perspective view of the compressor monitoring device of FIG. 1.
Figure 3:
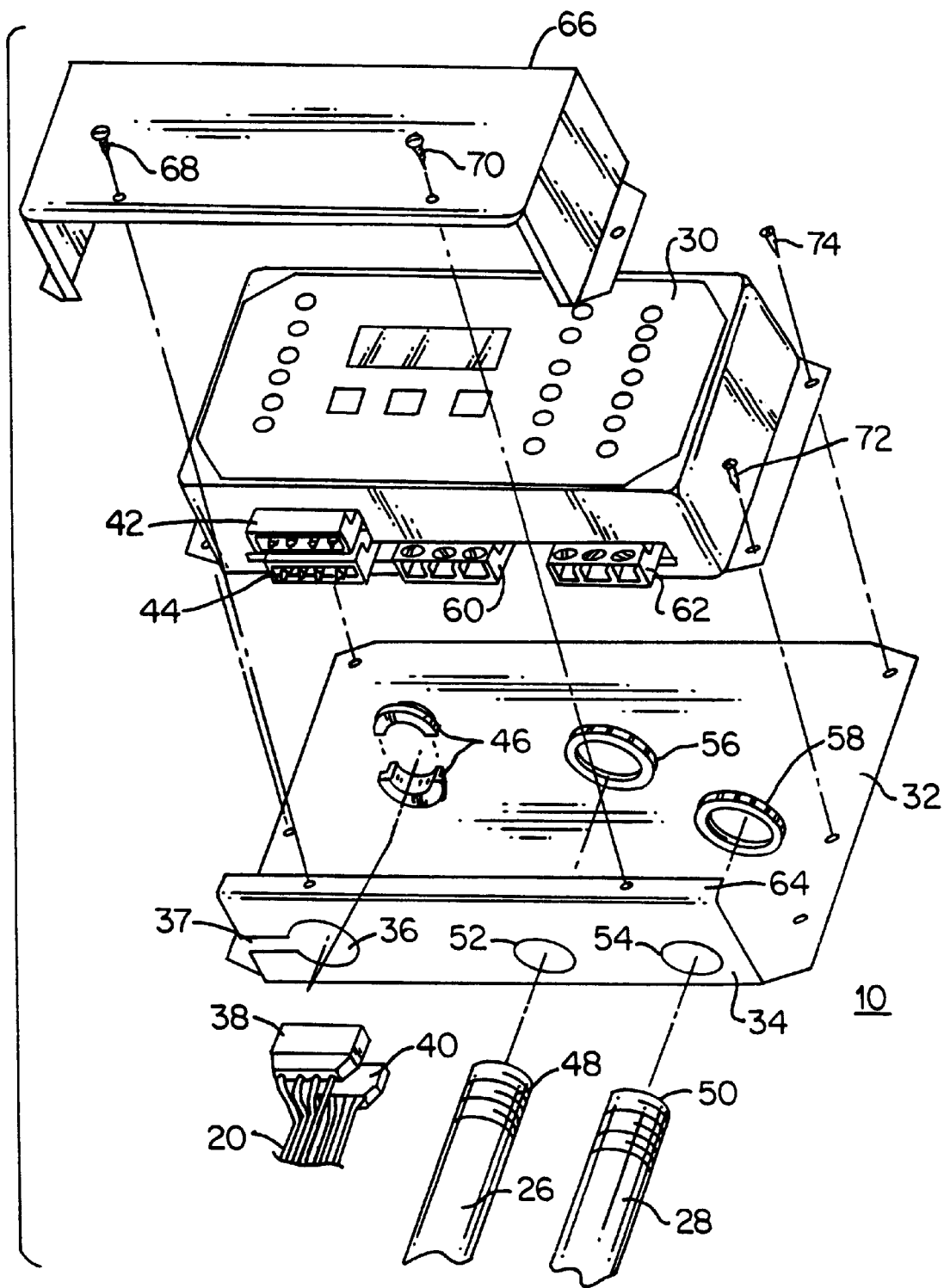
FIGS. 3 and 4 are exploded views illustrating certain of the component parts of the compressor monitoring device of FIG. 2.
Figure 4:
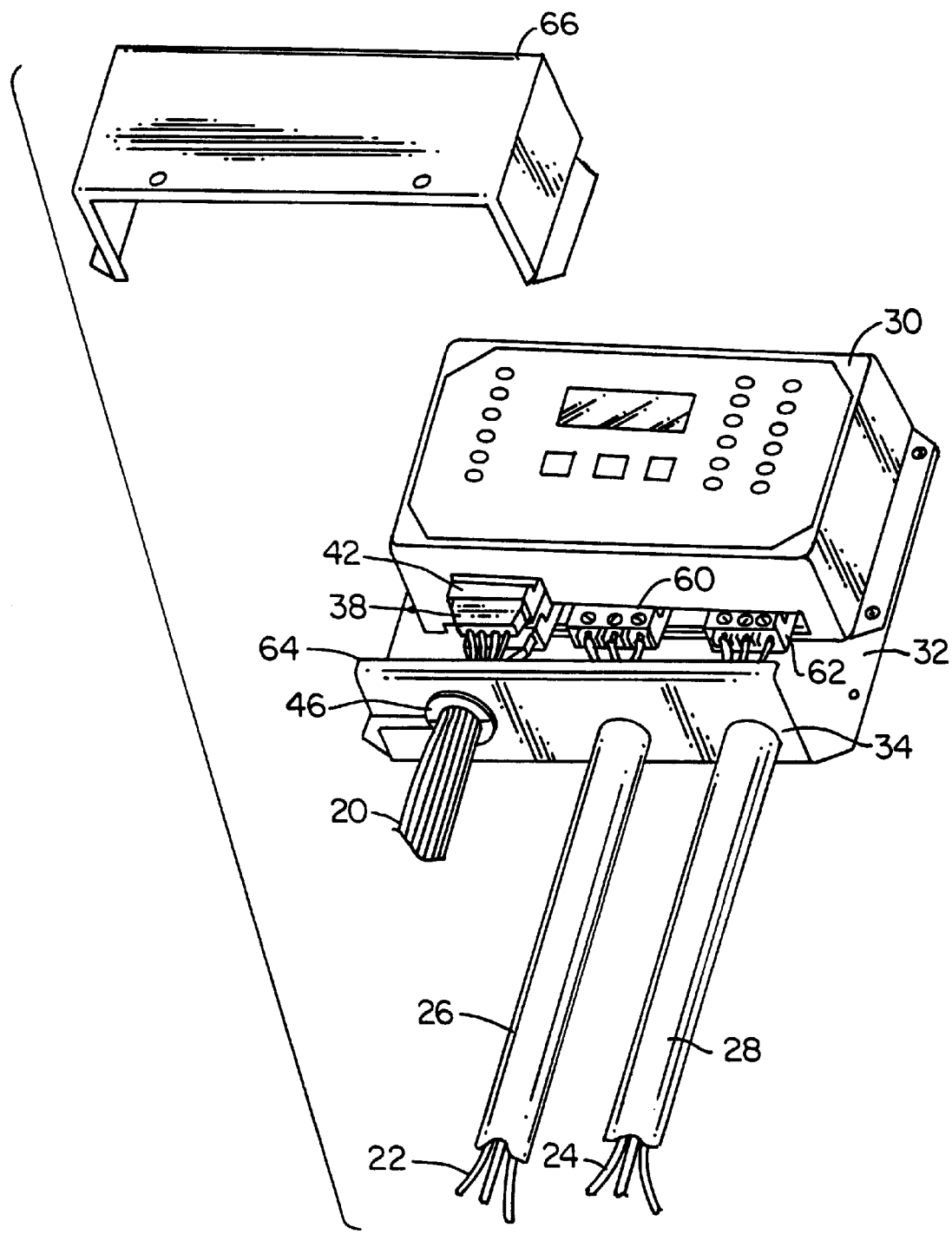

Referring now to FIGS. 2, 3 and 4, the compressor monitoring device 10 is illustrated in further detail. In particular, the compressor monitoring device is seen to include an electronic module 30 which contains electrical circuitry that gathers and monitors information provided by the wiring 20 that is connected to sensors. The module 30 is mounted to a lower housing member 32. The lower housing member 32 includes a wire receiving side 34 bent upwardly from the bottom of the housing member 22. It is to be appreciated that the wire receiving side 34 could be a separate housing piece that is merely joined to the lower housing member. The wire receiving side has an opening 36 located therein that includes a slot 37 extending to an outside edge of the wire receiving side 34. The wiring 20 is preferably pre-connected to electrical connectors 38 and 40. The wiring 20 upstream of the pre-connected connectors 38 and 40 is preferably inserted through the slot 37 and hence into the opening 36. The pre-connected connectors 38 and 40 will be in place behind the opening 36 at this time since there is adequate spacing between the module 30 and the receiving side to bring the connectors 38 and 40 into place behind the receiving side 34. The electrical connectors 38 and 40 are preferably pin type connectors that insert into matching electrical connectors 42 and 44 associated with the circuitry in the electronic module 30. The electrical connectors 42 and 44 preferably extend outwardly from the back side of the electronic module 30 so as to be easily connected to the electrical connectors 38 and 40.

Referring to FIG. 3, a two-piece soft rubber grommet 46 is inserted into the opening 36 so as to define a soft rubber peripheral edging to this opening. The two-piece grommet preferably includes fitted ends that allow the grommet to form a closed peripheral edging to the opening 36. This closed peripheral edging provides a soft contact for the wiring 20 that is nested in the opening 36.

Referring to FIG. 4, the electrical connectors 38 and 40 when connected to the electrical connectors 42 an 44 must be at an appreciable distance from the back surface of the wire receiving side 34. This distance must allow for easy access and removal of the electrical connectors 38 and 40 from the corresponding connectors 42 and 44. The electrical connectors 38 and 40 and wiring 20 can also be completely removed from the compressor monitoring device 10 by disconnecting the two-piece rubber grommet 46 and then sliding the wiring out through the slot 37. The electrical connectors 38 and 40 move out from behind the wire receiving side 34 due to the spacing between the receiving side and the electronic module 30.

Referring to FIG. 3, the conduits 26 and 28 preferably have threaded ends 48 and 50, which threadably engage a pair of openings 52 and 54 in the wire receiving side 34. The conduits 26 and 28 are secured to the wire receiving side 34 by locknuts 56 and 58 engaging the threaded ends 48 and 50. The outside diameters of the conduits 26 and 28 downstream of the threaded ends 48 and 50 are preferably larger than the diameters of the openings 52 and 54 so as to thereby define the extent to which the threaded ends can extend into the wire receiving side. The larger outside diameters of the conduits allow them to be firmly supported by the wire receiving side 34 as each conduit extends the required distance from the compressor monitoring device.

Referring to FIG. 4, the wiring 22 and 24 in the conduits 26 and 28 exits the threaded ends 48 and 50 and inserts into electrical connectors 60 and 62 extending from the backside of the electronic module 30. The electrical connectors 60 and 62 preferably include electrical contacts that may be secured by tightening screws. It is to be noted that the electrical contacts in the electrical connectors 60 and 62 could also be spring loaded contacts which maintain contact with the ends of the wiring 22 and 24 without the need for tightening screws. It is to be noted that the wiring 22 and 24 could replace one or more of the electrical connections made by the wiring 20 to the sensors or to the remote control. This wiring, however, in the preferred embodiment is relatively thick high voltage wiring carrying significantly higher current than that of the wiring 20. It is finally to be noted that the ends of the high voltage wiring 22 and 24 extend for an appreciable distance from the back surface of the wire receiving side 34 so as to be easily grasped for insertion or removal from the electrical connectors 60 and 62.

Referring to FIGS. 3 and 4, it is to be noted that the wire receiving side 34 preferably includes a top bent tab 64 which extends rearwardly toward the back side of the electronic module 30. The top bent tab 64 supports a housing member 66, which is put into place after all wiring is secured to the various electrical connectors extending from the electronic module 30. The housing member 66 is seen to include a top portion that is secured to the bent tab by sheet metal screws 68 and 70 threadably engaging openings in the top bent tab 64. Side portions of the removable housing member 66 are also preferably secured to the bottom portion of the lower housing member 32 by sheet metal screws.

Referring to FIGS. 2 and 3, screws such as 72 and 74 connect the electronic module 30 to the lower housing member 32 as well as to a support plate 76. The support plate 76 includes openings such as 78 and 80, which allow for the mounting of the compressor monitoring device 10 to the end 12 of the compressor 14. The support plate 76 provides a rigid cantilevered support for the other assembled components of the compressor monitoring device 10.

Although a preferred embodiment of the present invention has been described and illustrated, it will be apparent to those skilled in the art that changes or modifications may be made without departing from the scope of the present invention. For example, the wire receiving side 34 does not have to be formed from the same piece of sheet metal as the bottom portion of the housing member 32. Furthermore, the various receptacles 42, 44, 60 and 62 could be replaced by any number of other types of receptacles that could form appropriate connections to the wiring 20, 22 and 24. It is therefore intended that the scope of the invention be limited only by the following claims.

What is claimed is:

1. A housing for electronic circuitry which monitors the operation of a compressor, said housing comprising:
    an electronic module containing the electronic circuitry and at least one electrical connection device for connecting the electronic circuitry to external wiring;
    a first housing member to which the electronic module is mounted;
    a second housing member, spaced from a side of the electronic module having the at least one electrical connection device, said second housing member having openings therein for receiving external wiring connected to the at least one connection device; and
    a third housing member, removably connected to said second housing member so as to protect a portion of the external wiring and the at least one connection device to the wiring.

2. The housing of claim 1 wherein said third housing member comprises a top portion and two side portions wherein said top portion is removably connected to said second housing member.

3. The housing of claim 2 wherein each of said side portions is removably connected to said first housing member.

4. The housing of claim 1 further comprising:
    at least one conduit containing at least a portion of the external wiring, said conduit being secured to said second housing member and extending from the outer side of said second housing member so as to support the wiring for a predefined distance away from said second housing member.

5. The housing of claim 4 wherein said conduit includes a threadable end extending through an opening in said second housing member and engaging a nut on the inner side of said second housing member.

6. The housing of claim 1 wherein said electronic module includes a plurality of electrical connection devices for connecting the electronic circuitry to said external wiring and wherein said external wiring includes wiring having an end connector said wiring extending through one of said holes having a soft peripheral grommet which contacts said wiring and wherein said end connector is removably connected to at least one of said electrical connection devices of said electronic module.

7. The housing of claim 1 further comprising at least one conduit secured to said second housing member and extending from the outer side of said second housing member, and wherein said external wiring includes wiring extending through said conduit to at least one electrical connection device of said electronic module.

8. The housing of claim 7 wherein said third housing member comprises a top portion end two side portions wherein said top portion is removably connected to a bent tab portion of said second housing member.

9. The housing of claim 7 wherein said second housing member is spaced a distance from one side of the electronic module having the plurality of electrical connection devices whereby access can be gained to the wiring and the respective connections to said electrical connection devices of said electronic module when said third housing member is disconnected from said second housing member.

10. The housing of claim 1 wherein said first housing member and said second housing member are integral parts of a single housing piece and wherein said second housing member is bent upwardly from said first housing member.

* * * * *